United States Patent [19]
Kilby

[11] 4,042,948
[45] Aug. 16, 1977

[54] INTEGRATED CIRCUIT ISOLATION WITH MESAS AND/OR INSULATING SUBSTRATE

[75] Inventor: Jack S. Kilby, Dallas, Tex.

[73] Assignee: Texas Instruments Incorporated, Dallas, Tex.

[21] Appl. No.: 471,634

[22] Filed: May 20, 1974

Related U.S. Application Data

[63] Continuation of Ser. No. 218,206, Aug. 14, 1962, abandoned, which is a continuation of Ser. No. 811,476, May 6, 1959, abandoned.

[51] Int. Cl.$^2$ .................... H01L 27/04; H01L 27/12
[52] U.S. Cl. ......................... 357/49; 148/187; 307/303; 357/47; 357/48; 357/50; 357/51; 357/55; 357/56
[58] Field of Search ................ 357/40, 48, 49, 50, 357/47, 51; 317/101 A

[56] References Cited

U.S. PATENT DOCUMENTS

| 2,655,625 | 10/1953 | Burton | 357/45 |
| 2,663,830 | 12/1953 | Oliver | 357/46 |
| 2,793,145 | 5/1957 | Clarke | 357/34 |
| 2,938,130 | 5/1960 | Noll | 357/48 |
| 3,029,366 | 4/1962 | Lehovec | 357/48 |

*Primary Examiner*—William D. Larkins
*Attorney, Agent, or Firm*—Harold Levine; James T. Comfort; James O. Dixon

[57] ABSTRACT

Isolation of integrated circuit components using an insulating substrate (such as ceramic or intrinsic semiconductor) and/or using mesas to separate components laterally and to define passive components.

13 Claims, 8 Drawing Figures

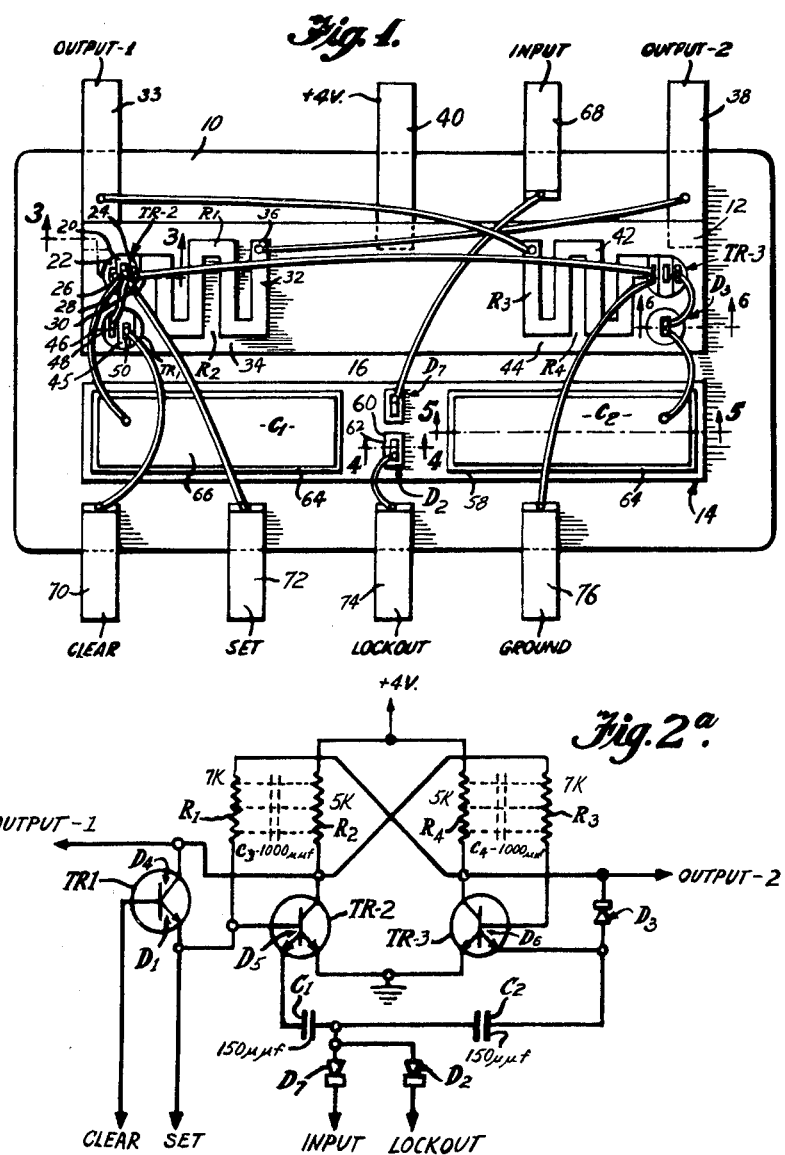

INTEGRATED CIRCUIT ISOLATION WITH MESAS AND/OR INSULATING SUBSTRATE

This is a continuation of application Ser. No. 218,206, filed Aug. 14, 1962, which was a continuation of application Ser. No. 811,476, filed May 6, 1959 (both now abandoned).

Many methods and techniques for miniaturizing electronic circuits have been proposed in the past. At first, most of the effort was spent upon reducing the size of the components and packing them more closely together. Work directed toward reducing component size is still going on, but has nearly reached a limit. Other efforts have been made to reduce the size of electronic circuits, such as by eliminating the protective coverings from components, by using more or less conventional techniques to form the components of a complete circuit on a single substrate, and by providing the components with a uniform size and shape to permit closer spacings in the circuit packaging therefor.

All of these methods and techniques require a very large number and variety of operations in fabricating a complete circuit. For example, of all circuit components, resistors are usually considered the most simple to form, but when adapted for miniaturization by conventional techniques, fabrication requires at least the following steps:

a. Formation of the substrate
b. Preparation of the substrate
c. Application of terminations
d. Preparation of resistor material
e. Application of the resistor material
f. Heat treatment of the resistor material
g. Protection or stabilization of the resistor Capacitors, transistors, and diodes, when adapted for miniaturization, each require at least as many steps in the fabrication thereof. Unfortunately, many of the steps required are not compatible. A treatment that is desirable for the protection of a resistor may damage another element formed on the same substrate, such as a capacitor or transistor, and as the size of the complete circuit is reduced, such conflicting treatments, or interactions, become of increasing importance. Interactions may be minimized by forming the components separately and then assembling them into a complete package, but the very act of assembly may cause damage to the more sensitive components.

Because of the large number of operations required, control over miniaturized circuit fabrication becomes very difficult. To illustrate, many raw materials must be evaluated and controlled, even though they may not be well understood. Further, many testing operations are required and, even though a high yield may be obtained for each operation, so many operations are required that the over-all yield is often quite low. In service, the reliability of a circuit produced by methods of such complexity may also be quite low due to the tremendous number of controls required. Additionally, the separate formation of individual components requires individual terminations for each component. These terminations may eventually become as small as a dot of conductive paint. However, they still account for a large fraction of the usable area or volume of the circuit, and may become an additional cause of circuit failure or rejection due to misalignment.

In contrast to the approaches to miniaturization that have been made in the past, the present invention has resulted from a new and totally different concept for miniaturization. This concept and circuit elements made in accordance with this concept are the subject matter of a pending application, Ser. No. 791,602, filed Feb. 6, 1959, and assigned to the same assignee as this application now U.S. Pat. No. 3,138,743. Radically departing from the teachings of the prior art, it is proposed in that pending application that the ultimate in circuit miniaturization may be attained by using only one material for all circuit elements and a limited number of compatible process steps for the production thereof.

The above is accomplished by utilizing a body of semiconductor material exhibiting one type of conductivity, either N-type or P-type, and having formed therein a diffused region or regions of appropriate conductivity type to form a P-N junction between such region or regions and the semiconductor body or, as the case may be, between diffused regions. According to the principles of this invention, all components of a bistable multivibrator circuit are fabricated within the body so characterized by adapting the novel techniques described in said pending application, together with certain new techniques. It is to be noted that all components of the circuit are originally formed into a single body of semiconductor material and constitute portions thereof.

In a more specific conception of this invention, all components of a bistable multivibrator circuit are originally formed in or near one surface of a relatively thin semiconductor wafer characterized by a diffused P-N junction or junctions. Of importance to this invention is the concept of shaping. As described in detail in said pending application, this shaping concept makes it possible in a circuit to obtain the necessary isolation between components and to define the components or, stated differently, to limit the area which is utilized for a given component. Shaping may be accomplished in a given circuit in one or more of several different ways. These various ways include actual removal of portions of the semiconductor material, specialized configurations of the semiconductor material, such as rectangles, L-shapes, U-shapes, etc., selective conversion of intrinsic semiconductor material by diffusion of impurities thereinto to provide low resistivity paths for current flow, and selective conversion of semiconductor material of one conductivity type to conductivity of the opposite type wherein the P-N junction thereby formed acts as a barrier to current flow. In any event, the effect of shaping is to direct and/or confine paths for current flow, thus permitting the fabrication of circuits which could not otherwise be obtained in a single wafer of semiconductor material. As a result, the final circuit is arranged in essentially planar form. It is possible to shape the wafer during processing and to produce by diffusion the various circuit elements in a desired and proper relationship.

Certain of the circuit components described in said pending application have utility in and of themselves; however, they perhaps find their greatest utility as integral parts of miniature semiconductor network devices. Therefore, it is the principal object of this invention to provide a novel miniaturized semiconductor network device which functions as a bistable multivibrator.

It is another principal object of this invention to provide a miniature semiconductor network bistable multivibrator circuit including diode gate circuits.

It is still another principal object of this invention to provide a miniature semiconductor network diode gate in combination with a reverse-biased diode for providing a bias to the gate.

It is a further object of this invention to provide a miniature semiconductor gated multivibrator circuit fabricated from a single body of semiconductor material containing a plurality of diffused P-N junctions wherein all components of the diode gate are fabricated completely within the original body of semiconductor material, portions of the body being isolated from one another to prevent interference between different circuit elements.

It is still another object of this invention to provide a unique miniaturized bistable multivibrator circuit structure which is substantially smaller, more compact and simpler than circuit package heretofore developed using known techniques.

Other and further objects of the present invention will become more readily apparent from the following detailed description of the preferred embodiment of the invention when taken in conjunction with the appended drawings, in which:

FIG. 1 illustrates a top plan view of a miniature semiconductor network gated bistable multivibrator embodying this invention;

Figure 2B:
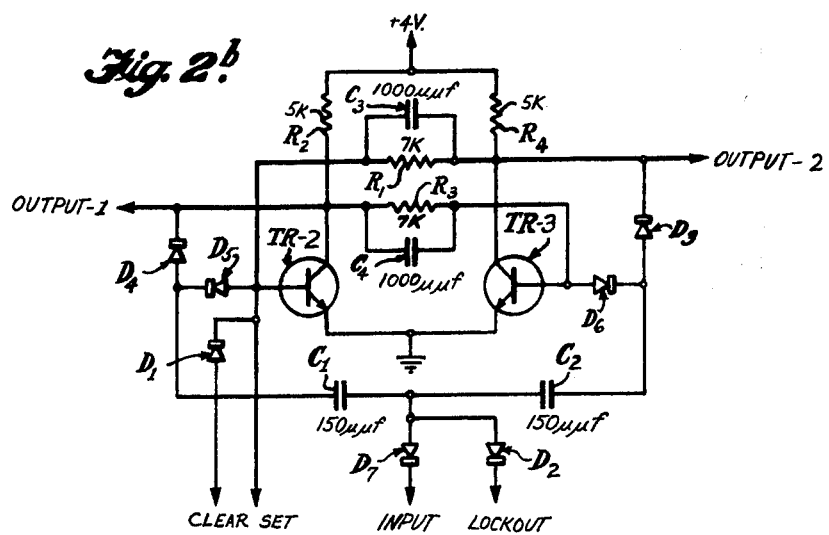
FIG. 2a illustrates a schematic circuit diagram of the semiconductor network illustrated in FIG. 1.
Figure 2C:
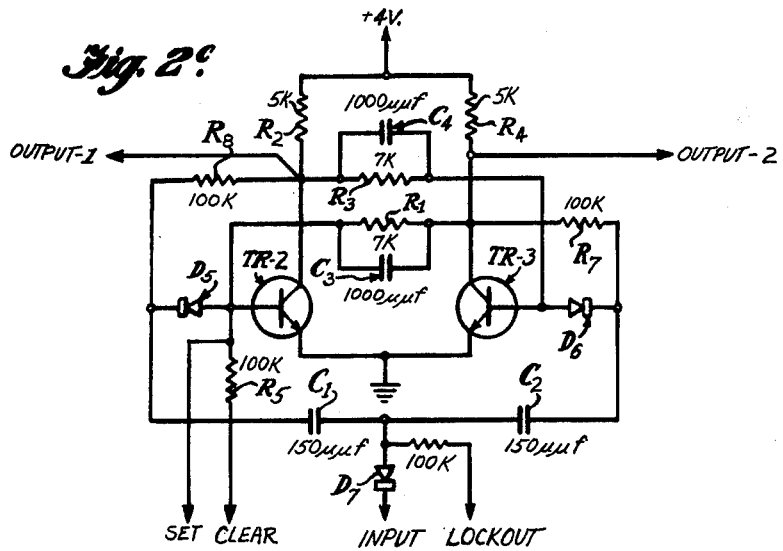

FIG. 2b and FIG. 2c illustrate circuit diagrams showing variations in the circuit illustrated in FIGS. 1 and 2a. In addition, FIGS. 2b and 2c illustrate the manner in which back-biased P-N junction diodes may be substituted for high-valued bias resistors in diode gate circuits; and FIGS. 3-6, inclusive, show cross sectional views of some of the semiconductor network components illustrated in FIG. 1.

With reference to the drawings, preferred embodiments of the present invention will now be described in detail in order to provide a better understanding of the principles of the invention and the various forms and embodiments of the invention.

As noted previously, this invention is primarily concerned with providing miniature electronic circuits. Also, as noted, the invention contemplates the use of a body of semiconductor material appropriately shaped and having formed therein diffused P-N junctions and components designed for the various circuit elements which can be integrated into or which constitute parts of the aforesaid body of semiconductor material.

FIGS. 1-5, inclusive, of said pending application illustrate in detail circuit elements which can be formed into a body of semiconductor material. It is noted at this point that the body of semiconductor material is of single crystal structure, and can be composed of any suitable semiconductor material. Examples of such suitable material are germanium, silicon, intermetallic alloys such as gallium arsenide, aluminum antimonide, indium antimonide, as well as others.

With particular reference to FIG. 1, there is shown a miniature semiconductor network which provides gated bistable multivibrator operation. Mounted on substrate 10 by solder glass are strips 12 and 14 of single crystal semiconductor material. The space 16 between these two strips was formed by originally starting with a single larger strip of semiconductor material and etching to divide the crystal into two portions. However, the purpose of this shaping operation is to provide isolation between the circuit components integrated with strips 12 and 14, and it is to be understood that substantial electrical isolation could be obtained by means other than etching completely through a larger crystal strip to form two strips; for example, electrical isolation could be provided by a high resistance area in the crystal between circuit components desired to be isolated. This high resistance will provide a substantial open circuit to prevent undesired interference between the circuit components involved. However, in the embodiment shown in FIG. 1, isolation between two portions of the multivibrator circuit is provided by etching the space 16 in an original crystal to form two crystal strips 12 and 14 which are physically separate, one from the other.

As described in said copending application, the original crystal is first completely diffused with a layer of P-type semiconductor material to form a P-N junction. Circuit components are then formed therein by selective etching of the semiconductor material and by selectively diffusing N-type material into the P layer. Metal contacts may then be plated or evaporated onto desired layers to form electrical connections.

Figure 3:
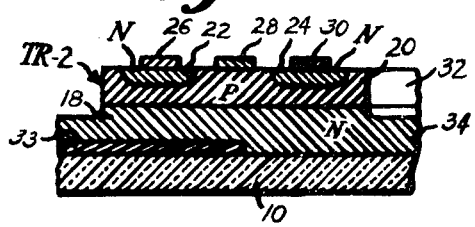

Formed in strip 12 is transistor TR-2 of the NPN type with a second N region diffused in the P-type base to form in effect a two-emitter transistor. A cross sectional view of TR-2 is shown in FIG. 3. This double emitter structure actually provides one NPN transistor plus an integral diode formed by the additional diffused PN junction. TR-2 has an N-type collector region 18 provided by the crystal strip 12, a P-type base region 20 and two N-type emitter regions 22 and 24. Ohmic contacts 26, 28, and 30 are plated or evaporated onto their corresponding semiconductor layers. Output lead 33 is soldered or alloyed to substrate 10, and extends beneath the left-hand end of strip 12 and makes ohmic contact therewith, and thereby also with collector region 18 of TR-2. Double emitter transistor TR-3 is identical with TR-2.

Contiguous with base region 20 is a strip 32 of diffused P-type material in strip 12 and formed in a tortuous path to define a cross-coupling resistor $R_1$ having a value of 7 kilohms (K). The left-half 34 of crystal strip 12, a portion of which underlies P-strip 32, defines a bias resistor $R_2$ having a value of 5K. An ohmic contact 36 is formed on the other end of P-strip 32 to provide means for electrically connecting this end of $R_1$ to the output lead 38. Resistance $R_2$ is connected to the bias lead 40 which is mounted on substrate 10 and passes beneath strip 12 into ohmic contact therewith. P-strip 42 and its corresponding underlying end crystal portion 44 define resistors $R_3$ and $R_4$ in an identical manner. The distributed capacitance at the PN junctions formed by P-strips 32 and 42 with their underlying corresponding N-strip portions provide a distributed capacitance equivalent to capacitors $C_3$ and $C_4$, each having a value of 1000 micro-microfarads.

Also formed in N-strip 12 is the transistor TR-1 having a collector region defined by an area of strip 12, a diffused P-layer 45 (FIG. 1) defining a base region and a diffused N-layer 46 (FIG. 1) defining a base region and a diffused N-layer 46 defining an emitter region. An ohmic contact 48 is plated on the emitter layer 46 and an ohmic contact 50 is plated on the base layer 45 so that electrical leads may be interconnected between these contacts and other elements, as described below. In cross section, TR-1 is similar to FIG. 3 with the exception that TR-1 has only one diffused emitter region instead of two. Even though TR-1 has the form of a transistor, it provides two junction diodes by means of its collector-base and emitter-base PN junctions. In this embodiment of the invention, the structure is utilized as two separate PN junction diodes $D_1$ and $D_4$ rather than to provide conventional transistor action.

Figure 6:
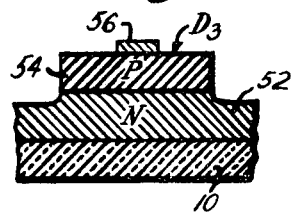

Also formed in strip 12 is a PN junction diode $D_3$, a cross sectional view of which is shown in FIG. 6. This diode is formed by a diffused PN junction comprising the N-crystal portion 52 and the diffused P-layer 54 carrying an ohmic contact 56.

Figure 4:
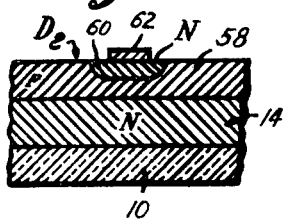

The P-layer 58 diffused into N-strip 14 is not etched away, and two N-layers are diffused into P-layer 58 to form identical junction diodes $D_2$ and $D_7$. A cross sectional view of diode $D_2$ is shown in FIG. 4. In this case, the PN junction is formed between the diffused P-layer 58 and the diffused N-layer 60 with the N-strip 14 merely acting as a substrate. A metal contact 62 is plated on N-layer 60 to provide means for interconnecting the junction with other circuit components or leads.

Figure 5:
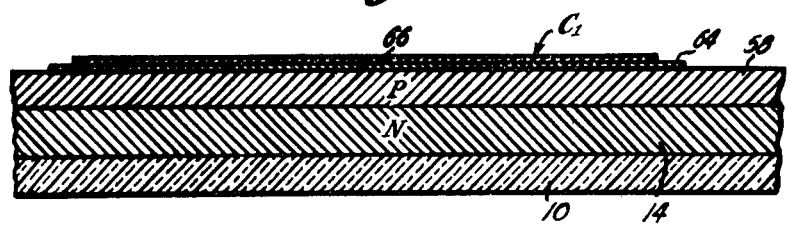

Also formed on strip 14 are two oxide-type coupling capacitors $C_1$ and $C_2$ formed as described in said pending application. As shown in FIG. 5, oxide capacitor $C_1$ comprises a silicon dioxide coating 64 on P-layer 58. This coating acts as a dielectric for the capacitor $C_1$. A metal plate 66 is then plated on top of oxide coating 64 to complete formation of the capacitor. The capacitor is defined by the two conductors, P-layer 58 and metal plate 66, separated by the dielectric oxide coating 64.

Additional leads are attached to the substrate 10, and are utilized when this bistable multivibrator is connected as a part of a binary counter. These leads are as follows: input lead 68; clear lead 70; set lead 72; lockout lead 74; ground lead 76. External wires, as shown in FIG. 1, interconnect the various circuit components with each other, and with the leads in a manner to provide bistable multivibrator operation.

the general operation of the circuit illustrated in FIG. 1 and just described will be briefly described to provide a better understanding of the structure of the device of FIG. 1. FIGS. 2b and 2c provide the same operation as FIG. 2a, but differ in circuit design. Semiconductor networks could also be constructed to conform exactly with the circuits shown in FIGS. 2b and 2c. For example, the difference between FIGS. 2a and 2b involves diodes $D_1$, $D_4$, $D_5$, and $D_6$. These diodes are shown as separate circuit elements in FIG. 2b, but are incorporated in other structures in FIG. 2a. In FIG. 2a, the diodes $D_1$ and $D_4$ are defined by the emitter-base and base-collector junction diodes respectively of TR-1, and diodes $D_5$ and $D_6$ of FIG. 2b are incorporated in transistors TR-2 and TR-3 of FIG. 2a in the form of second emitter-base junctions.

Another difference between FIGS. 2a and 2b is that the cross-coupling capacitors $C_3$ and $C_4$ of FIG. 2b have been replaced by the distributed capacitance between their corresponding resistors $R_1$ and $R_2$, and $R_3$ and $R_4$. As described above with respect to the circuit of FIG. 2a, $R_1$ and $R_3$ are formed by P-strips 32 and 42, respectively, and $R_2$ and $R_4$ are formed by N-crystal portions 34 and 44, respectively. Since the polarity across the capacitance thus formed is always the same, the junction-type distributed capacitance is satisfactory.

The difference between FIGS. 2b and 2c is that the 100 K resistors $R_5$, $R_6$, $R_7$, and $R_8$ of FIG. 2c are replaced by reverse-biased PN junction diodes $D_1$, $D_2$, $D_3$, and $D_4$, respectively, of FIG. 2b. The purpose of these 100 K resistors, shown in FIG. 2c, is to supply current to reverse bias the diode gates $D_5$, $D_6$, $D_7$, and $D_8$. Although this multivibrator circuit could be constructed as a miniature semiconductor network to correspond exactly with the schematic illustrated in FIG. 2c, semiconductor network techniques do not lend themselves as easily to providing high valued resistances such as the 100 K resistors $R_5$–$R_8$, inclusive. In particular, 100 K resistors require either very high resistivity semiconductor material or a large amount of space for a long path in lower resistivity material. Since the purpose of these resistors is to supply current to back bias diode gates, this current may also be obtained by replacing the resistors with reverse-biased PN junction diodes, effectively placing the diode gate and the biasing diode in series. Such substitutions result in the differences between the diagram shown in FIGS. 2b and 2c, the circuit shown in FIG. 2b being much easier to construct by semiconductor network techniques. These substitutions have been checked by temperature cycling the semiconductor network ultivibrator, and both the basic circuit of FIG. 2c and the revised circuit of FIG. 2b operate properly up to 110° C.

The preferred embodiment of the gated bistable multivibrator shown in FIG. 2a is designed for use as one stage of a binary counter. The set input lead is utilized to determine which transistor will be initially conducting and which initially non-conducting. Since both TR-2 and TR-3 are NPN transistors, a positive pulse on the base of transistor TR-2 will render that transistor conducting and TR-3 non-conducting. Negative trigger pulses may then be applied to the input lead through diode $D_7$, coupling capacitor $C_1$ and diode $D_5$ to cut off transistor TR-2 and render transistor TR-3 conducting. A second trigger pulse will return the circuit to its original condition. Selective application of pulses to the lockout lead may lock out or block trigger pulses applied to the input lead to render the multivibrator circuit insensitive to input pulses. A positive polarity pulse applied to the clear lead will return the circuit to its original condition. Output 1 and output 2 supply output pulses indicative of the state of their corresponding transistor.

Therefore, FIG. 2a illustrates a basic gated bistable multivibrator circuit diagram which represents the operation of the semiconductor network of FIG. 1. FIG. 2b is the equivalent of FIG. 2c, and also represents exactly the operation of FIG. 1. However, in FIG. 2b, the 100 K resistors of 2c have been replaced by reverse-biased PN junction diodes. FIG. 2a again is the full equivalent as far as operation is concerned of FIGS. 1, 2b, and 2c, but in order to adapt the circuit more easily to semiconductor network techniques, two separate diodes have been combined into a single transistor structure as collector-base and emitter-base diodes. In addition, two other diodes have been replaced by an additional emitter-base junction in each of the switching transistors TR-2 and TR-3.

It must be emphasized here that only several preferred embodiments of this invention have been described above, and that other variations and modifications thereof may be made without departing from the scope of this invention, which is defined in the appended claims.

Thus, for example, since it is known that intrinsic semiconductor material is characterized by a relatively high order of resistivity, the substrate could be formed therefrom; or, the entire unit could be formed from a block of intrinsic semiconductor material into which doping impurities are diffused in the regions occupied by the cut wafers in the drawing. According to this arrangement, Item 10 of FIG. 1 would be either a separate block of intrinsic material on which wafers 12 and 14 were mounted, or it would be part of the same physical piece of semiconductor material as areas 12 and 14, the latter differing therefrom only in electrical characteristics due to impurity doping.

I claim:

1. A device comprising an insulative substrate having relatively thin overlying extrinsic single crystal semiconductor material affixed on one major surface thereof, said overlying material being shaped to provide a plurality of regions therein said regions being electrically isolated from each other by substantial electrical impedance through said substrate and between said regions, said regions having pluralities of P-N junctions defined therein to establish independent electronically functional structures for the performance of resistive, reactive and active signal modification functions.

2. A device as defined in claim 1 wherein said substrate is comprised of single crystal intrinsic semiconductor material.

3. A device as defined in claim 1 wherein said insulative substrate is of a different material from said overlying material.

4. A device as defined in claim 3 wherein said substrate is comprised of ceramic material.

5. A device as defined in claim 4 wherein said substantial impedance results from structural discontinuities extending completely through said overlying material.

6. A device as defined in claim 3 wherein said substantial impedance results from structural discontinuities extending completely through said overlying material.

7. A device as defined in claim 3 wherein said substantial impedance results from high resistivity areas within said overlying material between said regions.

8. A semiconductor circuit complex comprising a wafer of high resistance intrinsic semiconducting material, and a plurality of zones of extrinsic semiconducting material of a first conductivity type disposed in said wafer and separated from each other by said intrinsic material, each of said zones having a semiconducting material of a second conductivity type disposed thereon, forming a P-N junction with said material of a first conductivity type, the device, formed by the semiconducting materials of opposite conductivity type in said zone separated by said P-N junction, having separate means for making contact to it, each of said zones and said devices being electrically isolated from each other by said intrinsic material.

9. A semiconductor integrated circuit device comprising a semiconductor substrate, a plurality of mesas of extrinsic semiconductor material located on a major face of said substrate and containing independent circuit components, at least some of the mesas including elongated regions of semiconductor material of a conductivity type opposite that of underlying semiconductor material formed by the introduction of conductivity-type-determining impurities, the elongated regions providing current paths generally parallel to said face, at least some of the means including active circuit components which have regions of semiconductor material of a conductivity type opposite that of underlying semiconductor material formed by the introduction of conductivity-type-determining impurities, parts of said regions of active circuit components being in at least some instances integrally joined with parts of the elongated regions, said substrate including a continuous region of uniform semiconductor material which provides a support for all of said mesas and said independent circuit components and being inactive as a part of any of said circuit components.

10. An integrated semiconductor circuit comprising a substrate of intrinsic semiconductor material, a plurality of mutually spaced extrinsic semiconductor regions at one face and spaced from the opposite face of said substrate, a substantial impedance existing through said substrate between said extrinsic regions for electrically isolating one from the other; at least one electrical circuit element at least partially in each extrinsic region, each electrical circuit element having a plurality of zones at the surface of the extrinsic region and means at said surface ohmically electrically connecting selected ones of said zones.

11. An integrated semiconductor circuit according to claim 10 wherein said extrinsic regions comprise separate semiconductor wafers mounted on said one face of said substrate.

12. An integrated semiconductor circuit comprising a semiconductor substrate, an extrinsic semiconductor region on one face and spaced from the opposite face of said substrate, said extrinsic region being a semiconductor wafer mounted on said one face of said substrate, a plurality of electrical circuit elements having semiconductor zones, all of said zones being wholly within said region and extending to the surface of said region, a substantial impedance existing between said electrical circuit elements for electrically isolating one from the other through said region and through said substrate, and electrical ohmic connections at the surface of said region between selected ones of said zones, said zones extending to the surface of said region.

13. An integrated circuit comprising a semiconductor substrate of intrinsic semiconductor material, an extrinsic semiconductor region on one face and spaced from the opposite face of said substrate, a plurality of electrical circuit elements having semiconductor zones, all of said zones being wholly within said region and extending to the surface of said region, a substantial impedance existing between said electrical circuit elements for electrically isolating one from the other through said region and through said substrate, and electrical ohmic connections at the surface of said region between selected ones of said zones, said zones extending to the surface of said region.

* * * * *